United States Patent [19]

Sheperd

[11] Patent Number: 5,155,560
[45] Date of Patent: Oct. 13, 1992

[54] SEMICONDUCTOR INDEX GUIDED LASER DIODE HAVING BOTH CONTACTS ON SAME SURFACE

[75] Inventor: John P. Sheperd, Rochester, N.Y.

[73] Assignee: Eastman Kodak Company, Rochester, N.Y.

[21] Appl. No.: 733,792

[22] Filed: Jul. 22, 1991

[51] Int. Cl.$^5$ .............................................. H01L 33/00
[52] U.S. Cl. ........................................ 357/17; 357/16; 357/48; 372/46; 372/50
[58] Field of Search ................... 357/4, 16, 17, 47, 48, 357/65; 372/43, 45, 46, 50

[56] References Cited

U.S. PATENT DOCUMENTS

| | | | |
|---|---|---|---|
| 4,318,059 | 3/1982 | Lang et al. | 372/50 |
| 4,747,110 | 5/1988 | Takahashi et al. | 372/46 |
| 4,829,534 | 5/1989 | Miyazawa et al. | 372/46 |
| 4,933,302 | 6/1990 | Costrini et al. | 372/46 |
| 4,995,049 | 2/1991 | Kahen et al. | 372/50 |
| 5,003,359 | 3/1991 | Abeles | 372/50 |
| 5,007,063 | 4/1991 | Kahen | 372/50 |

FOREIGN PATENT DOCUMENTS

| | | | |
|---|---|---|---|
| 58-184761 | 10/1983 | Japan | 357/17 |
| 61-174686 | 8/1986 | Japan | 372/46 |
| 61-278188 | 12/1986 | Japan | 372/46 |

*Primary Examiner*—William Mintel
*Assistant Examiner*—Minhloan Tran
*Attorney, Agent, or Firm*—Raymond L. Owens

[57] ABSTRACT

The present invention is directed to a laser diode which is formed of a substrate of a semi-insulating material having a body of a semiconductor material on a surface thereof. The body includes a first layer of one conductivity type on the substrate surface, a laser active layer on the first layer and a second layer of a semiconductor material of the opposite conductivity type on the active layer. Spaced isolation regions of the one conductivity type extend through the second layer and the active layer to the first layer to electrically isolate a portion of the second layer and active layer from the remaining portions of the layers. A first contact region of the opposite conductivity type extends into the isolated portion of the second layer and has a metal contact layer in ohmic contact therewith. A second contact region of the one conductivity type extends through the second layer and active layer to the first layer outside the isolation regions. A metal contact layer is in ohmic contact with the second contact region.

13 Claims, 1 Drawing Sheet

SEMICONDUCTOR INDEX GUIDED LASER DIODE HAVING BOTH CONTACTS ON SAME SURFACE

FIELD OF THE INVENTION

The present invention relates to a semiconductor index guided laser diode, and, more particularly to a semiconductor index guide laser diode having both contacts on the same surface of the device.

BACKGROUND OF THE INVENTION

Semiconductor laser diodes typically comprise a body of a semiconductor material having a p-n or p-i-n junction. When the junction is when appropriately biased, there is generated a flow of charge carriers which recombine to generate light. Index guided laser diodes include a waveguide having an index of refraction which is different from that of the portions of the diode on each side of the waveguide. This difference in the indices of refraction serves to confine the charge carriers to the waveguide and also confine the generated light to the waveguide. Reflection means, such as mirrors or the like, are provided at opposite ends of the waveguide to reflect the light back and forth along the waveguide and thereby form a substantially coherent beam of light. At least one end of the waveguide is partially transparent to allow the generated beam of light to be emitted from the diode. Such laser diodes generally having contacts at the top and bottom surfaces of the body so that the current flows from one electrode to the other vertically through the diode and across the junction.

With the development of optical communication systems which use laser diodes as sources of light, it has been found desirable to form the laser diodes as part of an integrated circuit. Such integrated circuits include other electrical components which form the drive circuit and/or control circuit for the laser diodes. However, to form a laser diode as part of an integrated circuit, it is necessary to have both contacts of the laser diode on the same side of the device. Also, it is desirable that the side of the integrated circuit on which both contacts are formed be planar to conform with the rest of the integrated circuit and thereby allow ease of electrically connecting the laser diode to the other components of the integrated circuit.

Attempts to form a laser diode having both contacts on the same side of the device have resulted in complex structures which are relatively difficult to make. For example, laser diodes have been formed on a conductive substrate of the same conductivity type as one side of the laser diode which is directly on the surface of the substrate. A separate body of semiconductor material of the same conductivity type as the substrate is formed on the substrate surface adjacent to but electrically isolated from the laser diode. The separate body serves as the contact to the side of the laser diode which is directly on the substrate surface. This provides both contacts, i.e., the contact to the other side of the laser diode and the separate body, which are on the same side of the substrate. However, this structure has the disadvantage that it requires extra material for the separate body which takes up additional room on the substrate. In addition, it requires additional processing to form the separate body. Also, if the separate body is electrically isolated from the laser diode by an air gap, this disrupts the planarity of the surface of the integrated circuit.

It is desirable to have a laser diode which has both electrical contacts on the same surface, is relatively easy to fabricate, and has a planar surface which facilitates it use as part of an integrated circuit having other components fabricated therein.

SUMMARY OF THE INVENTION

The present invention is directed to a semiconductor laser diode which comprises on the surface of a semi-insulating substrate a laser active layer of a semiconductor material between layers of a semiconductor material of opposite conductivity types. A portion of the active layer and the layer on the side of the active layer away from the substrate are electrically isolated from the remaining portions of such layers. One contact is made to the isolated portion of the layer on the side of the active layer away from the substrate and a second contact is made to the layer on the other side of the active layer outside the isolation means.

More particularly, the laser diode of the present invention comprises a substrate of a material which is at least semi-insulating and which has a surface. A first layer of a semiconductor material of one conductivity type is on the substrate surface, and a laser active layer is on the first layer. A second layer of a semiconductor material of a conductivity type opposite to that of the first layer is on the laser active layer. The first layer, active layer and second layer form a body of a semiconductor material having a surface. Electrical isolation means extend from the surface of the body through the second layer and the laser active layer and electrically isolate a portion of the second layer and the laser active layer from the remaining portions of the layers. A first electrical contact extends from the surface of the body to the isolated portion of the second layer, and a second electrical contact extends from the surface of the body to the first layer outside the isolation means.

The invention will be better understood from the following more detailed description taken with the accompanying drawings.

It should be understood that the drawings are not necessarily drawn to scale.

DETAILED DESCRIPTION

Figure 1:
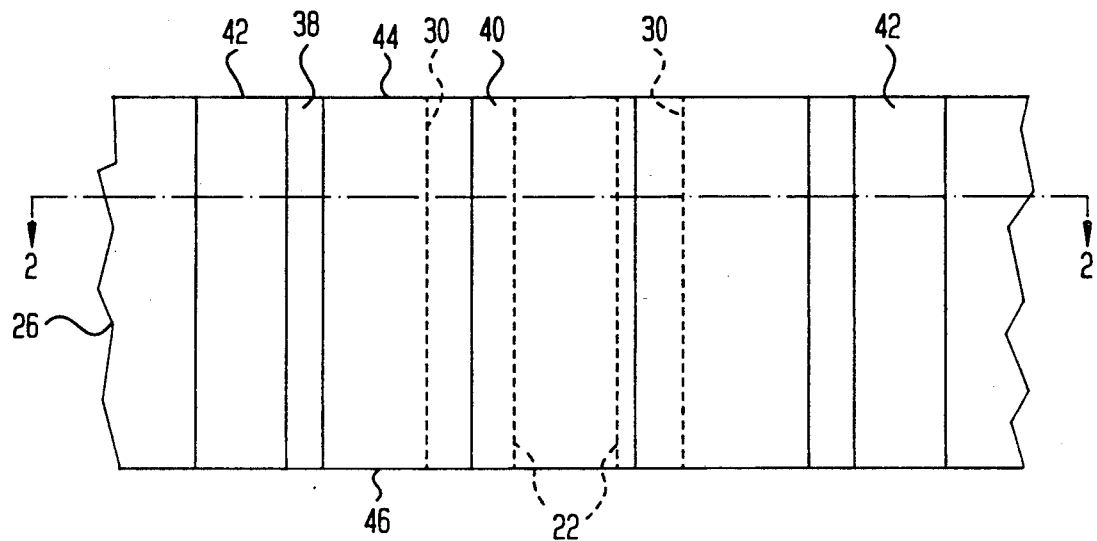
FIG. 1 is a top plan view of a laser diode in accordance with the present invention.
Figure 2:
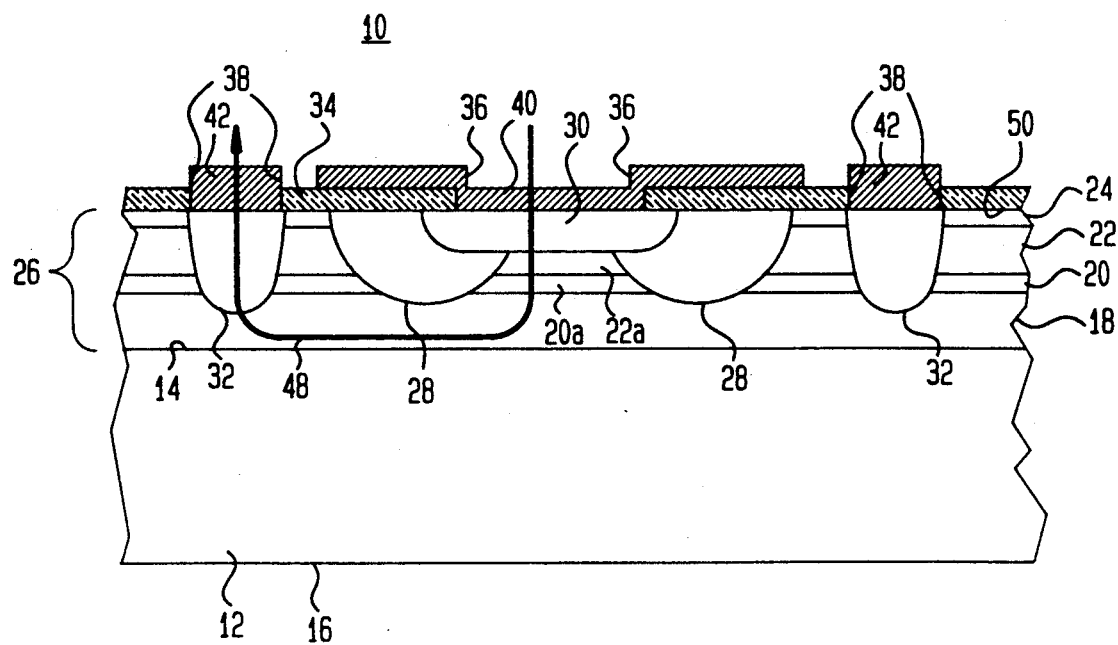
FIG. 2 is a cross-sectional view of the laser diode taken along line 2—2 of FIG. 1.

Referring now to FIGS. 1 and 2, there is shown a top plan view and cross-sectional view, respectively, of a laser diode 10 in accordance with the present invention. The laser diode 10 comprises a substrate 12 having opposed top and bottom surfaces 14 and 16, respectively. The substrate 12 is of a material which is at least semi-insulating, such as semi-insulating GaAs. On the substrate surface 14 is a first cladding layer 18. The first cladding layer 18 is of n-type conductivity (having a doping concentration of about $10^{18}$ impurities/cm$^3$) and is of a suitable semiconductor material, such as AlGaAs. On the first cladding layer 18 is a laser diode active layer 20 of semiconductor material. The active layer 20 may be of a uniform composition of a material having an index of refraction different from that of the cladding layer 18, such as GaAs. If the active layer 20 is of uniform composition, it may be of either conductivity type or intrinsic. However, preferably for index-guiding in a lateral direction, the active layer 20 is of a quantum well structure, either a single or multiple quantum well. A second cladding layer 22 is on the active layer 20. The second cladding layer 22 is of p-type conductivity (having a doping concentration of about $10^{18}$ impurities/cm$^3$) and is of the same material (GaAlAs) as the first cladding layer 18. A thin cap layer 24 having a top surface 50 may be provided on the second cladding layer 22. The cap layer 24 is preferably of p-type conductivity GaAs. The first cladding layer 18, active layer 20, second cladding layer 22 and cap layer 24 form a body 26 of the semiconductor laser diode 10.

A pair of spaced apart, substantially parallel n-type conductivity (doping concentration of about $10^{18}$ impurities/cm$^3$) isolation regions 28 extend from the surface 50 of the body 26 through the cap layer 24, the second cladding layer 22, active layer 20 and partially into the first cladding layer 18. The isolation regions 28 extend completely across the body 26 between two opposed edges 44 and 46 (see FIG. 1) thereof so as to isolate a portion 22a of the second cladding layer 22 and a portion 20a of the active layer 20 from the remaining portion of these layers. A highly conductive p-type conductivity (p+ type having a doping concentration of about $10^{19}$ impurities/cm$^3$) contact region 30 extends from the surface 50 of the body 26 through the cap layer 24 and partially into the isolated portion 22a of the second, cladding layer 22. The contact region 30 contacts portions of both the isolation regions 28. An n-type conductivity contact region 32 extends from the surface 50 of the body 26 through the cap layer 24, second cladding layer 22, active layer 20 and into the first cladding layer 18. Two separated n-type conductivity contact regions 32, each in the form of a strip, extend along opposite sides of the isolation regions 28. However, only one of the n-type conductivity contact regions 32 is required.

A layer 34 of an insulating material, such as silicon nitride, is on the surface 50 of the body 26. The insulating layer 34 has openings 36 and 38 therethrough over the p-type conductivity contact region 30 and each of the n-type conductivity contact regions 32 respectively. A metal contact layer 40 is on the insulating layer 34 and extends into the opening 36 to make ohmic contact with the p-type conductivity contact region 30. A separate metal contact layer 42 is in each of the openings 38 in the insulating layer 34 and makes ohmic contact with a n-type conductivity contact region 32.

In the operation of the laser diode 10, a voltage is placed between the contacts 40 and 42. This causes a flow of current, as indicated by the elongated arrow 48 in FIG. 2, through the contact region 30, isolated portion 22a of the second cladding layer 22, the isolated portion 20a of the active layer 20, and into the first cladding layer 18. The current then flows along the first cladding layer 18 under the isolation regions 28 to the contact region 32. As in any laser diode, this generates charge carriers which flow into the isolated portion 20a of the active layer 20 where they recombine to generate light. The difference in the indices of refraction of the active layer 20 and each of the first and second cladding layers 18 and 22 causes the confinement of both carriers and the generated light in the isolated portion 20a of the active layer 20. The isolated portion 20a of the active layer 20 forms a waveguide which extends between the opposed edges 44 and 46 of the body 26. The opposed edges 44 and 46, or at least the portion of the edges 44 and 46 which extend across the ends of the waveguide formed by the isolated portion 20a of the active layer 20, are made reflective. This made be done by cleaving the edges 44 and 46 or by coating them with a reflective material. The reflective edges 44 and 46 cause the light generated in the waveguide to be reflected back and forth along the waveguide to form a substantially coherent beam of light. At least one of the edges 44 and 46 is at least partially transparent to the light so that some of the substantially coherent beam of light is emitted therefrom.

Although the laser diode 10 is shown as having both ends of the waveguide extending to an edge of the body 26, at least one end of the waveguide can terminate within the body 26. The end terminated within the body 26 can be made reflective by etching a groove in the body 26 across the end of the waveguide and coating the etched surface with a reflective material. If both ends of the waveguide are terminated within the body 26, a groove can be etched at both ends and the etched surface at both ends is coated with a reflective material. The reflective material at least one end is made at least partially transparent to allow the generated beam of light to be emitted therefrom. An angled mirror may be provided across from the partially transparent end to reflect the emitted light away from the laser diode 10.

The laser diode 10 may be made by depositing in succession on the surface 14 of a substrate 12, the first cladding layer 18, the active layer 20, the second cladding layer 22 and the cap layer 24, if used. This may be done by any well known epitaxial deposition technique for the materials used for these layers, such as liquid phase epitaxy or any of the well known vapor phase epitaxy techniques. A masking layer is then formed on the surface of the body 26 and, using standard photolithographic techniques, openings or formed in the masking layer where the isolating regions 28 and n-type conductivity contact regions 32 are to be formed. Then a suitable n-type conductivity impurity is diffused or implanted into the body to form the isolation regions 28 and contact regions 32. The masking layer is then removed and a second masking layer is formed on the surface of the body 26. An opening is formed in the second masking layer, using standard photolithographic techniques, where the p-type conductivity contact region 30 is to be provided. Then a suitable p-type conductivity impurity is diffused or implanted into the body 26 to form the contact region 30. The second masking layer is then removed, and the insulating layer 34 is deposited on the surface of the body 26 using a chemical vapor deposition technique. The openings 36 and 38 are then formed through the insulating layer 34 over the contact regions 30 and 32 respectively using standard photolithographic techniques and etching. The metal contact layers 40 and 42 are then individually deposited using any well known deposition technique, such as vacuum evaporation or sputtering.

Thus, there is provided by the present invention an index guided laser diode in which the all the contacts, the contacts for both the p-type conductivity and the n-type conductivity side of the laser diode, are on the same side of the body of the laser diode. This allows the laser diode to be formed as part of an integrated circuit on a common substrate with other electrical components. In addition, the laser diode of the present invention provides a planar surface so that its contacts can be easily connected to the contacts of other components on an integrated circuit by conductive metallization which extends across the surface of the device. Also, the laser diode of the present invention is easy to manufacture since, after the various layers which form the laser diode are deposited on the substrate, only two separate diffusions are required. One of these diffusions forms the isolation region and the n-type conductivity contact region, and the other diffusions forms the p-type conductivity region. Furthermore, the laser diode of the present invention can be made with both ends of the laser diode being at opposite edges of the body of the device or with one or both of the ends being within the body.

It is to be appreciated and understood that the specific embodiments of the invention are merely illustrative of the general principles of the invention. Various modifications may be made consistent with the principles set forth. For example, the laser diode may be made of materials well known for laser diodes other than AlGaAs and GaAs and the doping concentrations in the layers and regions can be varied. Also, as previously stated, only one n-type conductivity contact region is required and the ends of the waveguide can be arranged either at the edges of the device or within the body of the device. In addition, the isolation region can be formed by other means, such as by implantation of oxygen or other materials which form an insulating material with the silicon substrate. Although the laser diode is shown with a cap layer, this cap layer may be removed from over the insulating region to improve device performance by reducing current leakage.

What is claimed is:

1. A laser diode comprising:
a substrate having a surface and of a material which is at least semi-insulating;
a first layer of a semiconductor material of one conductivity type on said surface of the substrate;
a laser active layer on said first layer, said active layer being of a semiconductor material which is capable of generating light upon recombination of charge carriers therein;
a second layer of a semiconductor material of a conductivity type opposite to that of the first layer on the active layer;
said first layer, active layer and second layer forming a body of semiconductor material having a surface;
electrical isolation means extending from the surface of the body through the second layer and active layer into the first layer and isolating a portion of the second layer and active layer from the remaining portion of said layers;
a first electrical contact electrically connected to the isolated portion of the second layer; and
a second electrical contact electrically connected to the first layer outside the isolation means.

2. The laser diode of claim 1 in which the isolation means comprises a pair of spaced, substantially parallel isolation regions of the one conductivity type extending from the surface of the body through the second layer and active layer to the first layer, the isolated portions of the second layer and the active layer being between the isolation regions.

3. The laser diode of claim 2 in which the first electrical contact comprises a first contact region of the opposite conductivity type extending from the surface of the body into the second layer, said first contact region being of a conductivity higher than that of the second layer.

4. The laser diode of claim 3 in which the first contact further comprises a metal contact layer on the surface of the body and in ohmic contact with the first contact region.

5. The laser diode of claim 4 in which the first contact region extends into a portion of each of the isolation regions.

6. The laser diode of claim 3 in which the second electrical contact comprises a second region of the one conductivity type extending from surface of the body through the second layer and active layer to the first layer.

7. The laser diode of claim 6 in which the second electrical contact further comprises a metal layer on the surface of the body and in ohmic contact with the second contact region.

8. The laser diode of claim 7 further comprising a layer of an insulating material on the surface of the body, said insulating material layer having openings therethrough over the contact regions and the metal contact layers extend through the openings to make ohmic contact with the respective contact regions.

9. The laser diode of claim 8 in which the body has a pair of opposed edges and the isolation regions extend to at least one of said edges so that the isolated portion of the active layer also extends to said edge.

10. The laser diode of claim 9 in which the isolation regions extend to both of said edges of the body and the isolated portion of the active layer extends to both of said edges.

11. The laser diode of claim 8 in which the body further comprises a cap layer of a semiconductor material of the opposite conductivity type on the second layer and the isolation regions and contact regions extend through the cap layer.

12. The laser diode of claim 8 in which the one conductivity type is n-type and the opposite conductivity type is p-type.

13. The laser diode of claim 8 in which the first and second layers are each of a semiconductor material having an index of refraction different from that of the active layer so as to provide for confinement of charge carriers and generated light in the active layer.

* * * * *